United States Patent
Lee

(10) Patent No.: US 6,529,419 B2
(45) Date of Patent: Mar. 4, 2003

(54) APPARATUS FOR VARYING DATA INPUT/OUTPUT PATH IN SEMICONDUCTOR MEMORY DEVICE

(75) Inventor: Joo Sang Lee, Seoul (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 0 days.

(21) Appl. No.: 10/028,431

(22) Filed: Dec. 28, 2001

(65) Prior Publication Data

US 2002/0085426 A1 Jul. 4, 2002

(30) Foreign Application Priority Data

Dec. 30, 2000 (KR) .......................... 2000-87288

(51) Int. Cl.[7] .............................................. G11C 16/04
(52) U.S. Cl. .............................. 365/189.02; 365/225.7
(58) Field of Search ........................ 365/189.02, 225.7, 365/189.05, 189.01, 230.02

(56) References Cited

U.S. PATENT DOCUMENTS 5,301,153 A * 4/1994 Johnson ..................... 365/200
5,812,466 A * 9/1998 Lee et al. .................... 365/200

* cited by examiner

Primary Examiner—David Lam
(74) Attorney, Agent, or Firm—Birch, Stewart, Kolasch & Birch, LLP

(57) ABSTRACT

An apparatus for varying a data input/output path in a memory device, includes DBSAs amplifying a signal loaded on a data bus, fuse circuits producing output signals of specific levels respectively in accordance with whether or not fuses are cut, input multiplexers each of which selects either an external signal inputted through a corresponding pad or another external signal inputted through a pad next to the corresponding pad in accordance with the output signals of the fuse circuits, and applies the selected signal to a write driver, and data input/output parts including output multiplexers, each of the output multiplexers selecting a signal outputted from either a corresponding one of the DBSAs or one next to the corresponding DBSA in accordance with the output signals of the fuse circuits, and outputting the selected signal through a corresponding pad.

15 Claims, 3 Drawing Sheets

X9 CONFIGURATION

X8 CONFIGURATION

| FUSE STATUS / I/O PART | I/O 8 | I/O 7 | I/O 6 | I/O 5 | I/O 4 | I/O 3 | I/O 2 | I/O 1 | I/O 0 |
|---|---|---|---|---|---|---|---|---|---|
| ALL I/Os NORMAL | ✚ | ✚ | ✚ | ✚ | ✚ | ✚ | ✚ | ✚ | ✚ |
| I/O 0 DEGRADED | ✖ | ✖ | ✖ | ✖ | ✖ | ✖ | ✖ | ✖ | ✖ |
| I/O 1 DEGRADED | ✖ | ✖ | ✖ | ✖ | ✖ | ✖ | ✖ | ✖ | ✚ |
| I/O 2 DEGRADED | ✖ | ✖ | ✖ | ✖ | ✖ | ✖ | ✖ | ✚ | ✚ |
| I/O 3 DEGRADED | ✖ | ✖ | ✖ | ✖ | ✖ | ✖ | ✚ | ✚ | ✚ |
| I/O 4 DEGRADED | ✖ | ✖ | ✖ | ✖ | ✖ | ✚ | ✚ | ✚ | ✚ |
| I/O 5 DEGRADED | ✖ | ✖ | ✖ | ✖ | ✚ | ✚ | ✚ | ✚ | ✚ |
| I/O 6 DEGRADED | ✖ | ✖ | ✖ | ✚ | ✚ | ✚ | ✚ | ✚ | ✚ |
| I/O 7 DEGRADED | ✖ | ✖ | ✚ | ✚ | ✚ | ✚ | ✚ | ✚ | ✚ |
| I/O 8 DEGRADED | ✖ | ✚ | ✚ | ✚ | ✚ | ✚ | ✚ | ✚ | ✚ |

✚ UNCUT FUSE
✖ CUT FUSE

APPARATUS FOR VARYING DATA INPUT/OUTPUT PATH IN SEMICONDUCTOR MEMORY DEVICE

RELATED APPLICATION

The present application claims the benefit of Korean Patent Application No. 87288/2000 filed Dec. 30, 2000, under 35 U.S.C. §119, which is herein fully incorporated by reference.

BACKGROUND OF THE INVENTION

1. Field of the Invention

The present invention relates to a semiconductor memory device, and more particularly, to an apparatus for varying a data input/output path in a semiconductor memory device having 9 data input/output lines (hereinafter abbreviated as X9) including a parity bit line, which allows an X9 construction of the semiconductor memory device to change into a construction having 8 data input/output lines (hereinafter abbreviated as X8) including no parity bit line, by varying an input/output path of data when memory cells corresponding to one of the input/output lines are degraded.

2. Discussion of the Related Art

In a general DRAM semiconductor memory device, a signal, which is outputted from a memory cell array and amplified by a bit line sense amplifier (BLSA), is transferred to a data bus line from a bit line under control of a column selector. The signal loaded on the data bus line is amplified by a data bus sense amplifier (DBSA) and then outputted through an output line and a pad to an appropriate location. An external signal inputted through the pad is loaded on the data bus through a write data driver and then amplified by the BLSA so as to be written in the corresponding memory cell.

A general semiconductor device having the X9 construction, as shown in FIG. 1A, includes DBSAs 10 and nine (9) data input/output parts I/00 to I/08 each of which includes an input/output pad 12. Input/output (write and read) operations of the device, as described above, are independently carried out by the respective data input/output parts I/00 to I/08.

Another general semiconductor device having the X8 construction, as shown in FIG. 1B, includes DBSAs 14 and eight (8) data input/output parts I/00 to I/07 each of which includes an input/output pad 16. Input/output (write and read) operations of the device, as described above, are independently carried out by the respective data input/output parts I/00 to I/07.

Unfortunately, in the semiconductor device having the X9 or X8 construction according to the related art, it is difficult to change the X9 construction of a product into the X8 construction because data are inputted/outputted only through the corresponding data input/output parts. Therefore, the X9-configured semiconductor devices according to the related art cannot be used if one of the memory cells corresponding to the input/output parts is degraded in the X9 construction, whereby the yield of the device is reduced and its product cost is increased.

SUMMARY OF THE INVENTION

Accordingly, the present invention is directed to an apparatus for varying a data input/output path in a semiconductor memory device that substantially obviates one or more problems due to limitations and disadvantages of the related art.

An object of the present invention is to provide an apparatus for varying a data input/output path in a semiconductor memory device to allow a X9-configured product to be transformed into a X8-configured product, whereby yield of the device is improved and the product cost is reduced.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an apparatus for varying a data input/output path in a semiconductor memory device according to an embodiment of the present invention, includes a plurality of DBSAs amplifying a signal loaded on a data bus after being amplified by a BLSA, a plurality of fuse circuits producing signals of specific levels respectively in accordance with whether or not fuses are cut, a plurality of input multiplexers each of which selects an external signal inputted through a corresponding pad or another external signal inputted through a pad next to the corresponding pad in accordance with the output signals of the fuse circuits and applies the selected signal to a write driver, and a plurality of data input/output parts including respectively a plurality of output multiplexers each of which selects a signal outputted from a corresponding one of the DBSAs or another one next to the corresponding DBSA in accordance with the output signal of the fuse circuits and outputs the selected signal to outside through a corresponding one of the pads.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
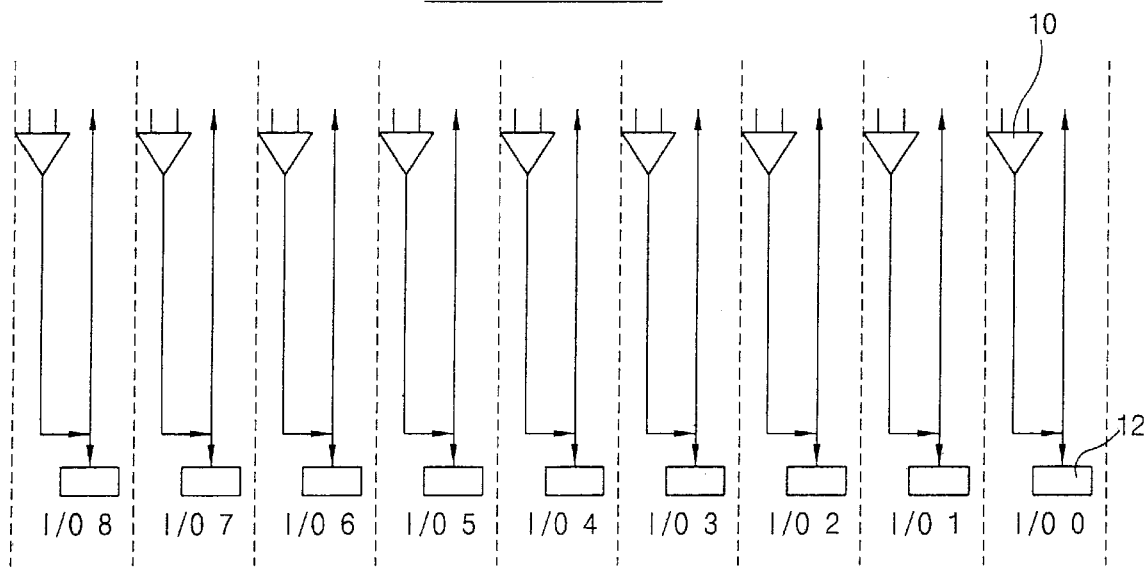
FIG. 1A illustrates a data input/output apparatus in a semiconductor memory device having an X9 construction in part according to a related art.
Figure 1B:
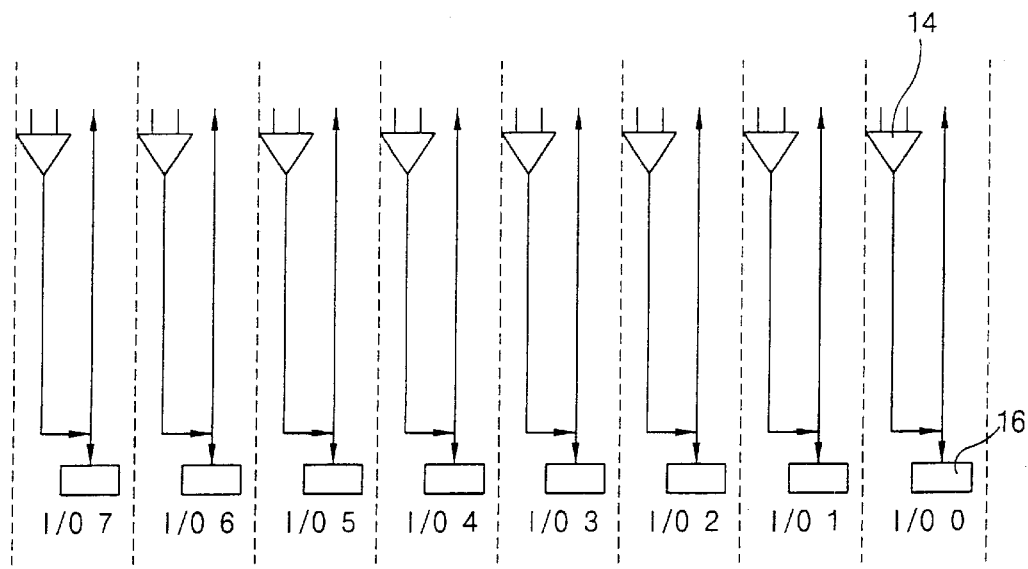
FIG. 1B illustrates a data input/output apparatus in a semiconductor memory device having an X8 construction in part according to a related art.
Figure 2:
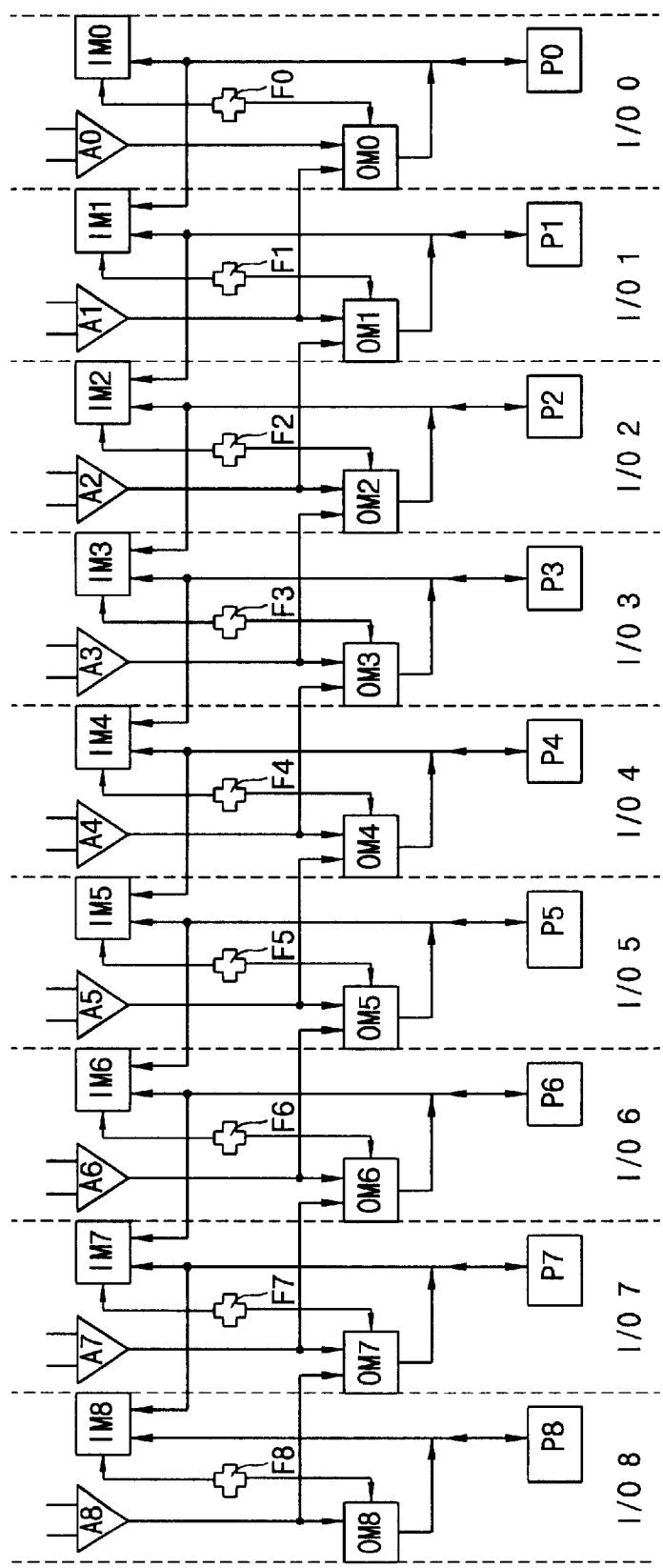
FIG. 2 illustrates a construction of an apparatus for varying a data input/output path in a semiconductor memory device having an X9 construction according to an embodiment of the present invention.

FIG. 2 illustrates a construction of an apparatus for varying a data input/output path in a semiconductor memory device having an X9 construction according to an embodiment of the present invention.

Referring to FIG. 2, an apparatus for varying a data input/output path in a semiconductor memory device is constructed with a plurality of DBSAs A0 to A8 amplifying a signal loaded on a corresponding data bus after having been amplified by a BLSA, a plurality of fuse circuits F0 to F8 producing signals of specific levels in accordance with whether or not the corresponding fuses are cut, a plurality of input multiplexers IM0 to IM8 each of which selects either an external signal inputted through a corresponding pad P0 to P8 or another external signal inputted through a pad next to the corresponding pad P0 to P8 in accordance with the output signals of the fuse circuits F0 to F8, and applies the selected signal to a write driver, and a plurality of data input/output parts I/00 to I/08 including respectively a plurality of output multiplexers OM0 to OM8 each of which selects a signal outputted from either a corresponding one of the DBSAs A0 to A8 or one next to the corresponding DBSA in accordance with the output signal of the fuse circuits F0 to F8, and outputs the selected signal to an appropriate outside location through a corresponding one of the pads P0 to P8.

Figures 3, 4:
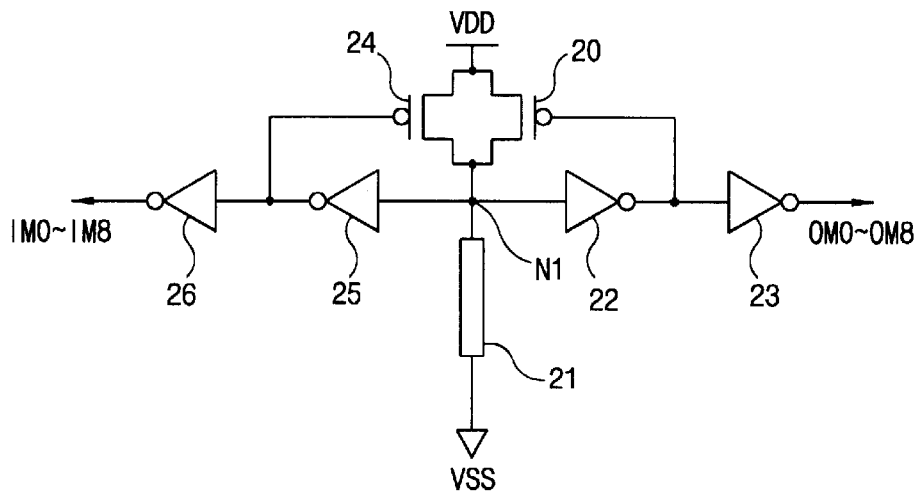
FIG. 3 illustrates a detailed construction of a fuse circuit in FIG. 2.
FIG. 4 illustrates a table for cutting fuses in the respective fuse circuits so as to change a data input/output path in FIG. 2 according to an embodiment of the present invention.

FIG. 3 shows a circuit diagram of each of the fuse circuits F0–F8 in FIG. 2. Each of the fuse circuits F0 to F8, as shown in FIG. 3, is constructed with a PMOS transistor 20 supplied with a power source voltage VDD from a power source, a fuse 21 have a first end connected to a drain of the PMOS transistor 20 and being grounded (VSS), an inverter 22 inverting a voltage signal of a node N1 connected between the drain of the PMOS transistor 20 and the first end of the fuse 21 and applying the inverted voltage signal to a gate of the PMOS transistor 20, an inverter 23 inverting the output of the inverter 22 and applying the inverted output to a corresponding one of the output multiplexers OM0 to OM8, a PMOS transistor 24 connected to the PMOS transistor 20 in parallel, an inverter 25 inverting a voltage signal of the node N1 connected between a drain of the PMOS transistor 24 and the first end of the fuse 21 and applying the inverted voltage signal to a gate of the PMOS transistor 24, and an inverter 26 inverting an output of the inverter 25 and applying the inverted output of the inverter 25 to a corresponding one of the input multiplexers IM0 to IM8.

Returning to FIG. 2, when receiving input signals from the corresponding fuse circuits F0 to F8 according to the cutting of the fuses, the input multiplexers IM1 to IM8 select the signals inputted through the adjacent lower data input/output part I/0(i−1) (where i=1 to 8) of the data input/output parts I/00 to I/08, respectively. For instance, the input multiplexer IM4 receives the signals input to the pad P3 in the adjacent lower data input/output part I/03. The least significant input multiplexer (i.e., IM0) receives only signals from the pad P0.

When receiving output signals from the corresponding fuse circuits F0 to F8 according to the cutting of the fuses, the output multiplexers OM0 to OM7 receive signals outputted from the adjacent upper DBSA A(i+1) (where i=0 to 7) included in the adjacent upper data input/output parts I/0(i+1) (where i=0 to 7) of the data input/output parts I/00 to I/08, respectively. For instance, the output multiplexer OM4 receives the signals from the adjacent upper data input/output part I/05 from the DBSA A5. The most significant output multiplexer (i.e., OM8) receives signals only from the DBSA A8.

The operation of the above-constructed apparatus for varying a data input/output path in a semiconductor device according to an embodiment of the present invention is explained as follows by referring to FIG. 2 to FIG. 4.

Referring to FIG. 3, when the fuse 21 is cut in one or more of the fuse circuits F0 to F8, the corresponding PMOS transistors 20 and 24 are turned on by the outputs of the inverters 22 and 25. The inverters 23 and 26 output a high level signal to the corresponding output multiplexers OM0 to OM8 and the input multiplexers IM0 to IM8 respectively.

Referring to FIG. 2 and FIG. 4, in one example, when a memory cell corresponding to the data input/output part I/00 is degraded, all the fuses included in the fuse circuits F0 to F8 are cut. Subsequently, the fuse circuits F0 to F8 apply signals of high level to the output multiplexers OM0 to OM8 and input multiplexers IM0 to IM8. In this case, the output multiplexers OM0 to OM7 select outputs of the DBSAs A1 to A8 included in the adjacent upper data input/output parts I/01 to I/08, respectively and selectively, and outputs them through the pads P0–P7, respectively. The most significant output multiplexer OM8 produces no output signal at this time. On the other hand, the input multiplexers IM1 to IM8 select the signals inputted through the adjacent lower data input/output parts I/00 to I/07, respectively and selectively, and the selected input signals are used appropriately (e.g., to a write driver to write data). The least significant input multiplexer IM0 produces no signal at this time.

In another instance, if a memory cell corresponding to the data input/output part I/08 is degraded, the fuse in the fuse circuit F8 is cut according to the table shown in FIG. 4. Therefore, the fuse circuit F8 applies a signal of high level to both the output multiplexer OM8 and the input multiplexer IM8, while the other fuse circuits F0 to F7 apply signals of low level to the output multiplexers OM0 to OM7 and the input multiplexers IM0 to IM7, respectively. Due to the application of the high level signal, the output and input multiplexers OM8 and IM8 do not select the signals from the DBSA A8 and the pad P8, respectively, but select "no is signal" switch. As a result, they produce no output signals. But, the other output multiplexers OM0 to OM7 select output signals of the corresponding DBSAs A0 to A7 and the input multiplexers IM0 to IM7 select the signals inputted through the corresponding data input/output pads P0–P7, respectively.

In this manner, the product of the X9 construction is operated as if it has the X8 construction. Similarly, when memory cells corresponding to one of the data input/output parts I/01 to I/07 are degraded, the product of the X9 construction in FIG. 2 is operated as if it has the X8 construction according to the table in FIG. 4 and circuit connections shown in FIG. 2 which would be well understood by one skilled in the art.

If, however, the construction of the fuse circuit in FIG. 3 is altered, the manner of cutting the fuses is realized in a manner opposite to that shown in FIG. 4.

In an X9 constructed product, when a memory cell corresponding to a specific data input/output part is degraded, the present invention allows reconstruction of the product of the X9 construction into the X8 construction without using a specific data input/output part by cutting the fuse(s) selectively, provided that a pin arrangement of the X9 product matches that of the X8 product.

Accordingly, the present invention increases yield of the semiconductor memory device and reduces the product cost by transforming the X9 construction of the product into the X8 construction by changing only the input/output path and not necessarily the physical structure of the device.

The present invention is not limited to converting only a X9 configuration into a X8 configuration, but is applicable to converting other configurations such as from an N configuration to an N−1 configuration.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. An apparatus for varying a data input/output path in a semiconductor memory device, comprising:
    a plurality of DBSAs amplifying a signal loaded on a data bus;
    a plurality of fuse circuits producing output signals of specific levels respectively in accordance with whether or not fuses are cut;
    a plurality of input multiplexers each of which selects either an external signal inputted through a corresponding pad or another external signal inputted through a pad next to the corresponding pad in accordance with the output signals of the fuse circuits, and applies the selected signal to a write driver; and
    a plurality of data input/output parts including respectively a plurality of output multiplexers, each of the output multiplexers selecting a signal outputted from either a corresponding one of the DBSAs or one next to the corresponding DBSA in accordance with the output signals of the fuse circuits, and outputting the selected signal through a corresponding pad.

2. The apparatus of claim 1, at least one of the fuse circuits comprises:
    a first PMOS transistor supplied with a power source voltage;
    a fuse having a first end connected to a drain of the first PMOS transistor and a second end being grounded;
    a first inverter inverting a voltage signal of a node connected between the drain of the first PMOS transistor and the first end of the fuse and applying the inverted voltage signal to the first PMOS transistor;
    a second inverter inverting an output of the first inverter and applying the inverted output to a corresponding output multiplexer;
    a second PMOS transistor connected to the first PMOS transistor in parallel;
    a third inverter inverting a voltage signal of the node and applying the inverted voltage signal to the second PMOS transistor; and
    a fourth inverter inverting an output of the third inverter and applying the inverted output of the third inverter to a corresponding input multiplexer.

3. The apparatus of claim 1, wherein, when receiving signals from the corresponding fuse circuits according to a fuse cutting, the input multiplexers select signals inputted through adjacent lower data input/output parts of the data input/output parts, respectively.

4. The apparatus of claim 3, wherein, at predetermined times, the least significant input multiplexer of the input multiplexers produces no signal.

5. The apparatus of claim 1, wherein, when receiving signals from the corresponding fuse circuits according to a cutting of fuses, the output multiplexers select signals outputted from the DBSAs included in adjacent upper data input/output parts of the data input/output parts, respectively.

6. The apparatus of claim 5, wherein, at predetermined times, the most significant output multiplexer of the output multiplexers produces no signal.

7. An apparatus for varying a data input/output path comprising:
    a plurality of fuse circuits selectively generating control signals in accordance with a fuse cutting; and
    a plurality of input multiplexers, each assigned to a different data input part among a plurality of data input parts, and selecting either an input signal from the assigned data input part or an input signal from a data input part to which an adjacent input multiplexer is assigned in accordance with the control signals.

8. The apparatus of claim 7, wherein the adjacent data input part is an adjacent lower data input part.

9. An apparatus for varying a data input/output path comprising:
    a plurality of fuse circuits selectively generating control signals in accordance with a fuse cutting;
    a plurality of input multiplexers, each assigned to a particular data input part and selecting either an input signal from the assigned data input part or an input signal from an adjacent data input part in accordance with the control signals; and
    a plurality of output multiplexers, each assigned to a particular data output part and selecting either an output signal of the assigned data output part or an output signal of an adjacent data output part in accordance with the control signals.

10. The apparatus of claim 9, wherein the adjacent data output part is an adjacent upper data output part.

11. The apparatus of claim 9, wherein at least one of the fuse circuits comprises:
    a first PMOS transistor supplied with a power source voltage;
    a fuse having a first end connected to a drain of the first PMOS transistor and a second end being grounded;
    a first inverter inverting a voltage signal of a node connected between the drain of the first PMOS transistor and the first end of the fuse and applying the inverted voltage signal to the first PMOS transistor;
    a second inverter inverting an output of the first inverter and applying the inverted output to a corresponding one of the output multiplexers;
    a second PMOS transistor connected to the first PMOS transistor in parallel;
    a third inverter inverting a voltage signal of the node and applying the inverted voltage signal to the second PMOS transistor; and
    a fourth inverter inverting an output of the third inverter and applying the inverted output of the third inverter to a corresponding one of the input multiplexers.

12. An apparatus for varying a data input/output path comprising:
    a plurality of fuse circuits selectively generating control signals in accordance with a fuse cutting; and
    a plurality of input multiplexers, each assigned to a particular data input part and selecting either an input signal from the assigned data input part or an input signal from an adjacent data input part in accordance with the control signals, wherein at least one of the fuse circuits comprises:
a first PMOS transistor supplied with a power source voltage;
a fuse having a first end connected to a drain of the first PMOS transistor and a second end being grounded;
a first inverter inverting a voltage signal of a node connected between the drain of the first PMOS transistor and the first end of the fuse and applying the inverted voltage signal to the first PMOS transistor;
a second PMOS transistor connected to the first PMOS transistor in parallel; a second inverter inverting a voltage signal of the node and applying the inverted voltage signal to the second PMOS transistor; and
a third inverter inverting an output of the second inverter and applying the inverted output of the second inverter to a corresponding one of the input multiplexers.

13. An apparatus for varying a data input/output path comprising:
a plurality of fuse circuits selectively generating control signals in accordance with a fuse cutting; and
a plurality of output multiplexers, each assigned to a different data output part among a plurality of data output parts, and selecting either an output signal of the assigned data output part or an output signal of a data output part to which an adjacent output multiplexer is assigned in accordance with the control signals.

14. The apparatus of claim 13, wherein the adjacent data output part is an adjacent upper data output part.

15. An apparatus for varying a data input/output path comprising:
a plurality of fuse circuits selectively generating control signals in accordance with a fuse cutting; and
a plurality of output multiplexers, each assigned to a particular data output part and selecting either an output signal of the assigned data output part or an output signal of an adjacent data output part in accordance with the control signals,
wherein at least one of the fuse circuits comprises:
a first PMOS transistor supplied with a power source voltage;
a fuse having a first end connected to a drain of the first PMOS transistor and a second end being grounded;
a first inverter inverting a voltage signal of a node connected between the drain of the first PMOS transistor and the first end of the fuse and applying the inverted voltage signal to the first PMOS transistor;
a second inverter inverting an output of the first inverter and applying the inverted output to a corresponding one of the output multiplexers;
a second PMOS transistor connected to the first PMOS transistor in parallel; and
a third inverter inverting a voltage signal of the node and applying the inverted voltage signal to the second PMOS transistor.

* * * * *